(12) United States Patent
Wang et al.

(10) Patent No.: US 6,987,696 B1
(45) Date of Patent: Jan. 17, 2006

(54) METHOD OF IMPROVING ERASE VOLTAGE DISTRIBUTION FOR A FLASH MEMORY ARRAY HAVING DUMMY WORDLINES

(75) Inventors: Zhigang Wang, Sunnyvale, CA (US); Nian Yang, Mountain View, CA (US); Shenqing Fang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 6 days.

(21) Appl. No.: 10/885,268

(22) Filed: Jul. 6, 2004

(51) Int. Cl.
*G11C 16/00* (2006.01)
(52) U.S. Cl. .................... 365/185.29; 365/185.09; 365/185.17; 365/185.18; 365/210
(58) Field of Classification Search .............. None
See application file for complete search history.

(56) References Cited

U.S. PATENT DOCUMENTS

| | | | | |
|---|---|---|---|---|
| 5,311,466 A | * | 5/1994 | Natale et al. | 365/185.23 |
| 5,559,742 A | * | 9/1996 | Lee et al. | 365/200 |
| 5,734,609 A | * | 3/1998 | Choi et al. | 365/185.17 |
| 6,009,017 A | | 12/1999 | Guo et al. | |
| 6,028,788 A | * | 2/2000 | Choi et al. | 365/185.11 |
| 6,215,702 B1 | | 4/2001 | Derhacobian et al. | |
| 6,246,611 B1 | | 6/2001 | Pawletko et al. | |
| 6,295,228 B1 | | 9/2001 | Pawletko et al. | |
| 6,307,784 B1 | | 10/2001 | Hamilton et al. | |
| 6,309,926 B1 | | 10/2001 | Bell et al. | |
| 6,331,951 B1 | | 12/2001 | Bautista, Jr. et al. | |
| 6,344,994 B1 | * | 2/2002 | Hamilton et al. | 365/185.05 |
| 6,356,482 B1 | | 3/2002 | Derhacobian et al. | |
| 6,370,061 B1 | | 4/2002 | Yachareni et al. | |
| 6,400,624 B1 | | 6/2002 | Parker et al. | |
| 6,442,074 B1 | | 8/2002 | Hamilton et al. | |
| 6,456,533 B1 | | 9/2002 | Hamilton et al. | |
| 6,522,585 B2 | | 2/2003 | Pasternak | |
| 6,778,437 B1 | * | 8/2004 | Achter et al. | 365/185.05 |

* cited by examiner

*Primary Examiner*—Tan T. Nguyen
(74) *Attorney, Agent, or Firm*—Renner, Otto, Boisselle & Sklar, LLP

(57) ABSTRACT

Techniques for erasing memory devices of a flash memory array having a plurality of operative wordlines and at least one dummy wordline adjacent an end one of the operative wordlines are disclosed. Erasing the memory devices can include applying a gate voltage to the wordlines and applying a bias voltage to the dummy wordlines. In one arrangement, an electrical connection is established between the dummy wordline and the end one of the operative wordlines.

12 Claims, 4 Drawing Sheets

METHOD OF IMPROVING ERASE VOLTAGE DISTRIBUTION FOR A FLASH MEMORY ARRAY HAVING DUMMY WORDLINES

TECHNICAL FIELD

The present invention relates generally to the field of non-volatile memory devices and, more particularly, to a method of improving erase voltage distributions for a flash memory array that has one or more dummy wordlines located adjacent an operational wordline.

BACKGROUND

A pervasive trend in modern integrated circuit manufacture is to increase the amount of data stored per unit area on an integrated circuit memory unit, such as a flash memory unit. That is, as flash memory technology progresses, the speed and memory density becomes higher and higher. Modern flash memory units are characterized by the non-volatility of the charge stored in the arrays of memory cells that make up the memory unit.

Due to the high density of charge storing cells, various techniques for improving process margin in memory unit fabrication have been employed. One technique is to place dummy wordlines adjacent a top wordline and a bottom wordline of a memory cell array.

From time-to-time, use of the memory unit may involve erasing some or all of the cells. For example, to erase an array of floating gate memory devices or an array of dielectric charge trapping memory devices, a relative large negative gate voltage (e.g., about −9.3 volts in the case of floating gate memory devices) can be applied to the wordlines of the array for a predetermined amount of time (or "pulse" duration). Bitlines of the array can be grounded during the erase operation. Also during the erase operation, a first dummy wordline adjacent the top wordline and a second dummy wordline adjacent the bottom wordline can be grounded.

This arrangement can lead to coupling between top wordline and the first dummy wordline and between the bottom wordline and the second dummy wordline during the erase operation. In the cells defined by the top wordline and the bottom wordline (referred to respectively as the top row of cells and the bottom row of cells), the threshold voltage (Vt) distribution can become degraded due to the coupling and erasing these cells can take a relatively long time. For example, with reference to FIG. 1, shown is a graph of the threshold voltage (Vt) distribution for the cells of a conventionally erased floating memory cell array. A first distribution curve C1 corresponds to the threshold voltage distribution for the wordlines disposed between the top and bottom wordlines (or middle wordlines) where insubstantial coupling to adjacent dummy wordlines is present. A second distribution curve C2 corresponds to the threshold voltage distribution for the top wordline and the bottom wordline where coupling to the dummy wordlines during the erase operation occurs. As shown graphically, the curve C2 is upwardly shifted relative to the curve C1. A difference between the curves, or delta Vt, can be about 1 volt. As indicated, this difference can slow erase operation of the top and bottom row of the array. As a result, the middle rows of cells will have a tendency to erase faster than the top and bottom rows of cell.

If erase speed is slowed too much, the top and bottom rows of cells may not become fully erased during application of the erase pulse. For example, a portion of the distribution curve C2 may be above a desired erase threshold voltage (Vt_erase). If the top and bottom rows of cells do not pass an erase verification, it is possible to re-erase the sector of memory cells. Alternatively, a longer erase pulse could be used. But the coupling described above and any corrective operation tend to push the memory cells into depletion mode, which leads to wider erase distributions and poor flash memory device operation.

Accordingly, there exists a need in the art to improve erasing of a memory array that includes dummy wordlines.

SUMMARY OF THE INVENTION

According to one aspect of the invention, the invention is directed to a method of erasing memory devices of a flash memory array having a plurality of operative wordlines and at least one dummy wordline adjacent an end one of the operative wordlines. The method can include applying a gate voltage to the wordlines; and applying a bias voltage to the dummy wordlines.

According to another aspect of the invention, the invention is directed to a method of erasing memory devices of a flash memory array having a plurality of operative wordlines and at least one dummy wordline adjacent an end one of the operative wordlines. The method can include establishing an electrical connection between the dummy wordline and the end one of the operative wordlines; and applying a gate erase voltage to the wordlines.

According to yet another aspect of the invention, the invention is directed to a flash memory unit configured for an erase operation. The flash memory unit can include a sector of memory devices defined by a plurality of operational wordlines and a plurality of bit lines; at least one dummy wordline adjacent an end one of the operational wordlines; and a logic unit electrically connecting the dummy wordline and the end one of the operational wordlines.

BRIEF DESCRIPTION OF DRAWINGS

These and further features of the present invention will be apparent with reference to the following description and drawings, wherein.

DISCLOSURE OF INVENTION

Figure 1:
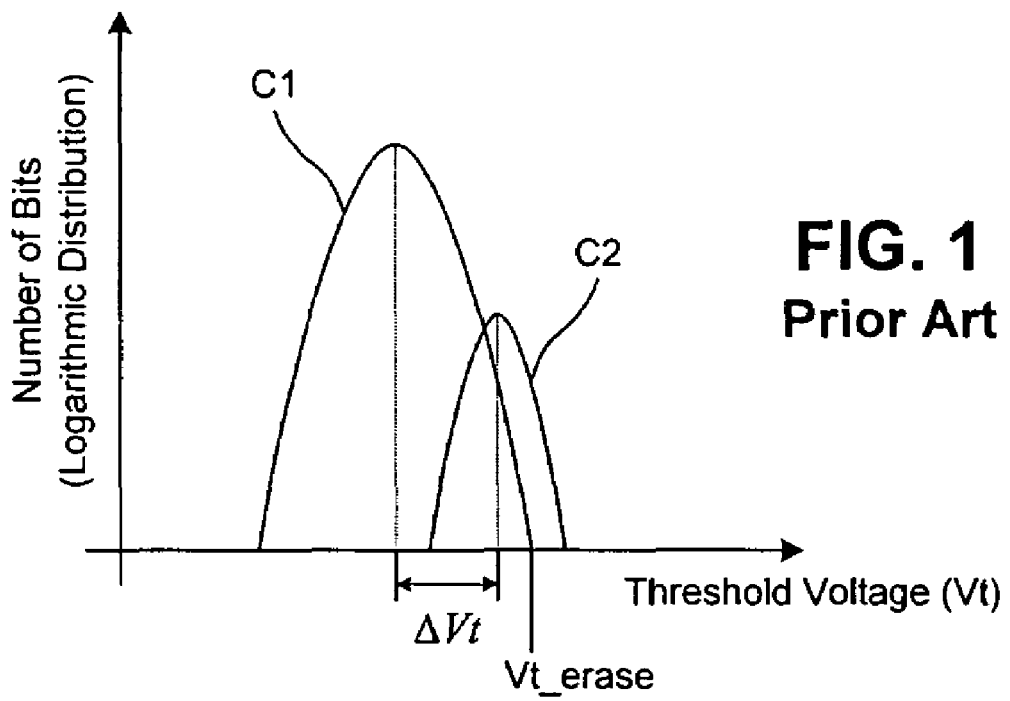
FIG. 1 is a graph of erase threshold voltage distribution for a flash memory array when erased according to a conventional erase technique.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

Aspects of the present invention relate to a method of erasing non-volatile, flash electrically erasable and programmable memory devices, such as floating gate memory devices or charge trapping dielectric memory devices. More specifically, the method relates to removing charge from a charge storing region(s) of the memory devices to return the memory devices to a blank, or unprogrammed, state. The method involves applying a bias potential to a dummy wordline located adjacent a top wordline of a sector of memory devices during the erase operation. In similar fashion, a bias potential can be applied to second dummy wordline located adjacent a bottom wordline of the sector of memory devices during the erase operation. In one embodiment, the dummy wordline(s) can be biased by electrically connecting the dummy wordline to the adjacent operational wordline.

The techniques described herein are applicable to a variety of flash memory devices, including NOR architecture memory devices such as floating gate memory devices and dielectric charge storing devices having two or more charge storing regions per device. It should be recognized that other types of memory devices, such as NAND architecture memory devices, also can be erased using the techniques described herein. Nevertheless, the present invention will be described in the exemplary context of erasing a sector of floating gate memory devices.

Figure 2:
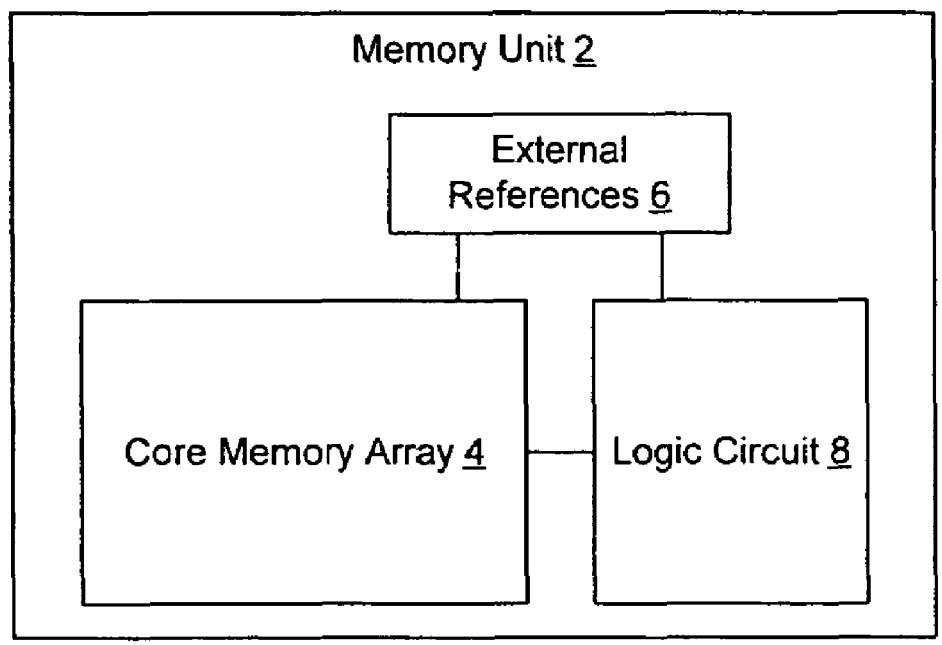
FIG. 2 is a schematic block diagram of an exemplary memory unit having a plurality of core memory devices to which a method of programming in accordance with the present invention can be applied.

With reference to FIG. 2, shown is a schematic block diagram of an exemplary memory unit 2. The memory unit 2 can include a core memory array 4 containing a plurality of memory devices that include, for example, core memory devices for storing data, and dynamic reference memory devices for tracking data level behavior of the core memory devices over time. Other memory devices, such as external references 6, can also form a part of the memory unit 2. The external reference 6 are separate from the core memory array 4 and can include, for example, erase verify reference cells, program verify reference cells and soft programming reference cells. Various operations of the memory unit 2, including, for example, programming, verifying, reading and erasing, can be controlled by a logic circuit 8. As one skilled in the art will appreciate, the memory unit 2 can be used by a customer of the memory unit 2 to store information, such as data or executable code.

Figure 3:
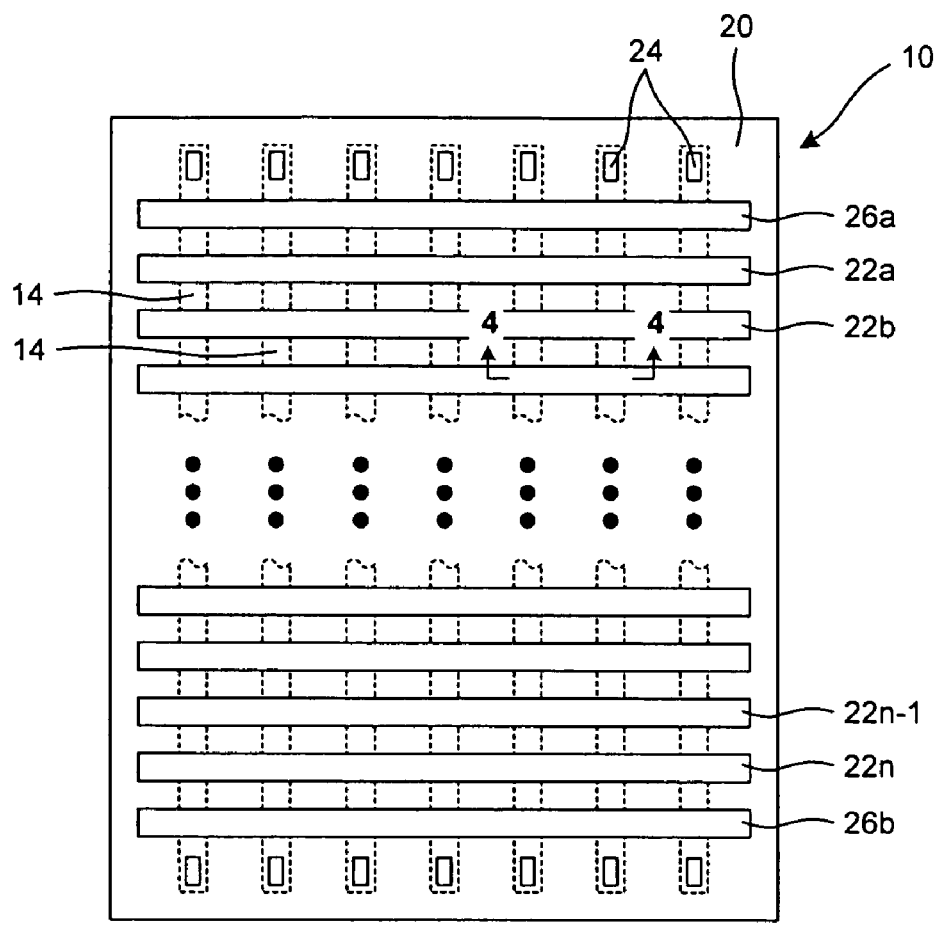
FIG. 3 is a schematic block diagram of an example core memory array sector from the memory unit.

With additional reference to FIG. 3, shown is a top view, schematic block diagram of an exemplary core memory array sector 10. It should be understood that the core memory array sector 10 can be sized as desired. The memory array 4 of the memory unit 2 can include multiple sectors 10.

Figure 4:
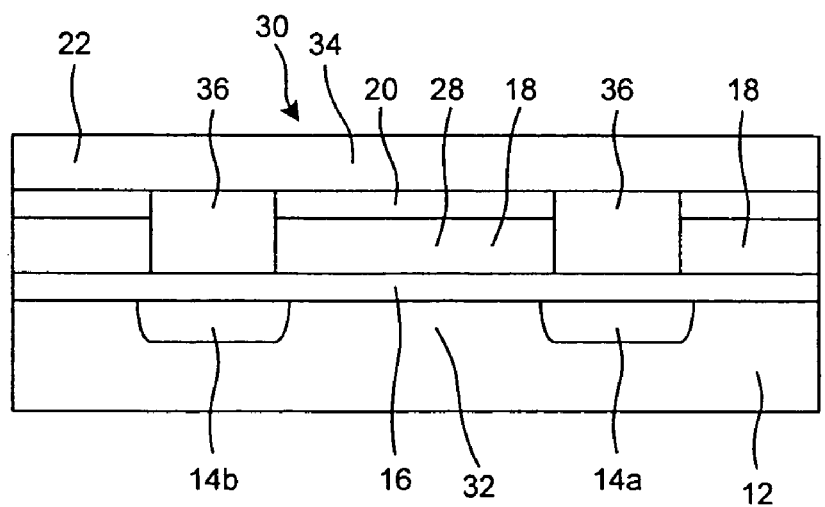
FIG. 4 is a schematic cross-section illustration of an exemplary core memory device from the core memory array taken along the line 44 of FIG. 3.

With additional reference to FIG. 4, the memory array 10 can include a semiconductor substrate 12 having a plurality of bitlines 14 (also referred to herein as conductive regions) formed in buried bitline format. Above the bitlines 14 is formed a lower dielectric layer, or tunnel dielectric layer 16, a charge storing layer 18, and a top dielectric layer 20. A plurality of wordlines 22a through 22n can be formed over the top dielectric layer 20. Bitline contacts 24 can be used to establish electrical connection to the bitlines 14.

Adjacent a first wordline 22a, which is also referred to herein as a top wordline 22a, can be a first dummy wordline 26a. Adjacent a last wordline 22n, which is also referred to herein as a bottom wordline 22n, can be a second dummy wordline 26b. The top and bottom wordlines 22 can be considered end wordlines 22 and the wordlines 22 disposed between the end wordlines can be considered center or middle wordlines 22. The dummy wordlines 26 are formed to assist in forming high quality wordlines 22. For example, the presence of the dummy wordlines 26 improve process margin during manufacture of the sector 10.

In the illustrated embodiment, the charge storing layer 18 is conductive (e.g., made from doped-polysilicon) and forms a floating gate 28 in the area between adjacent bitlines 14 and under the wordlines 22 to operatively form a "floating gate" memory device (or cell) 30. For each device 30, adjacent pairs of bitlines 14 form conductive regions that function respectively as a source and a drain during various programming, verifying, reading and erasing operations. Interposed between each pair of bitlines 14, the substrate 12 forms a channel region 32 operatively controlled by the application of voltage to the corresponding wordline 22 that functions as a gate electrode. Therefore, the wordline 22 can be considered to define a control gate 34. In alternative arrangements, control gates are formed from individual conductive islands or pads that are interconnected by the wordlines 22. An interdielectric layer 36 may be present between the floating gates 28 to isolate the floating gates 28 from one another.

In another embodiment, the charge storing layer 18 is non-conductive (e.g., made from a dielectric material such as silicon nitride). This arrangement results in the formation of dielectric charge storing devices, or dual cell memory devices, and includes a pair of complimentary charge trapping regions that can be independently programmed and read. Such a configuration allows for the storing of a first unit of charge (e.g., a normal bit) adjacent one of the bitlines 14 and a second unit of charge (e.g., a complementary bit) adjacent the other of the bitlines 14. In this embodiment, the charge storing layer 18 may continuously overlie the substrate in the area of the array 10.

In both embodiments, the application of appropriate voltages to the wordlines 22 and the bitlines 14 allows for the addressing of the memory devices 30 of the sector such that each memory device 30 can be programmed, read, verified and/or erased. For simplicity of the discussion herein, only the operation of one core memory device 30 will be described. However, the remaining memory devices 30 can have a corresponding structure and operation. As will become more apparent below, the wordlines 22 form an operative component of the memory devices 30 and can be considered operative wordlines 22. The dummy wordlines 26 can be physically arranged with the bitlines 14, the dielectric layers 16 and 20 and the charge storing layer 28 in the manner that the operational wordlines 22 are arranged with these structures. However, the dummy wordlines 26 are present to assist in the manufacturing process and are not used to form operative memory devices 30, even though the physical structure of charge storing cells may be present in the area of the dummy wordlines 26.

As one skilled in the art will appreciate, the illustrated memory device 30 is exemplary and modifications to the memory device 30 can be made. Such modifications can include changes to the physical arrangement of the core memory device 30 (e.g., type of memory device), materials used, doping parameters and the like. However, the programming, verifying, reading and/or erasing techniques described herein can be used in conjunction with such a modified device.

For purposes of the present disclosure, the programming technique to store charge in the floating gate 28 involves hot electron injection, also referred to as channel hot electron injection (CHE). However, it should be appreciated that modifications to the programming techniques can be made to accommodate variations in the specific memory device used.

Using hot electron injection, the floating gate 28 can be programmed to store electrons by applying voltages to one of the bitlines 14 (e.g., bitline 14a functioning as the drain) and to the wordline 22 (e.g., functioning as the control gate 32). The other bitline 14 (e.g., bitline 14b functioning as the source) provides carriers (e.g., electrons) for the CHE programming of the memory device 30. In one embodiment, a bias voltage potential is applied to the source to supply greater control over electron injection, which leads to enhanced data retention capability of the memory device 30. For instance, the source bias potential can function to limit programming current of the programmed cell and reduce bitline leakage from unprogrammed cells on the same bitline.

The voltages applied to the control gate 34, the source and the drain of the programmed cell generate a vertical electric field through the dielectric layers 16 and 20 and the charge storing floating gate 28 and a lateral electric field along the length of the channel 32 from the source to the drain. At a given threshold voltage, the channel 32 will invert such that electrons are drawn off the source and begin accelerating toward the drain. As the electrons move along the length of the channel 32, the electrons gain energy and upon attaining enough energy, the electrons are able to jump over the potential barrier of the bottom dielectric layer 16 and into the floating gate 28 where the electrons become trapped. These accelerated electrons are termed hot electrons and once injected into the floating gate 28, stay in the floating gate 28.

Verifying the programmed state of the memory device 30 and reading of the memory device 30 can be carried out in similar manners. For example, to read the memory device 30, a voltage can be applied to one of the bitlines 14 which is also referred to as the drain during verify and read operations and a voltage can be applied to the control gate 34. The other bitline 14, which is also referred to as the source during verify and read operations, can be grounded. During these operations, an amount of current drawn across the channel 32 can be used as an indication of memory device 30 threshold voltage and can be compared against a reference current(s) (as indications of reference threshold voltages) to determine the data state of the "read" memory device 30.

Figure 5:
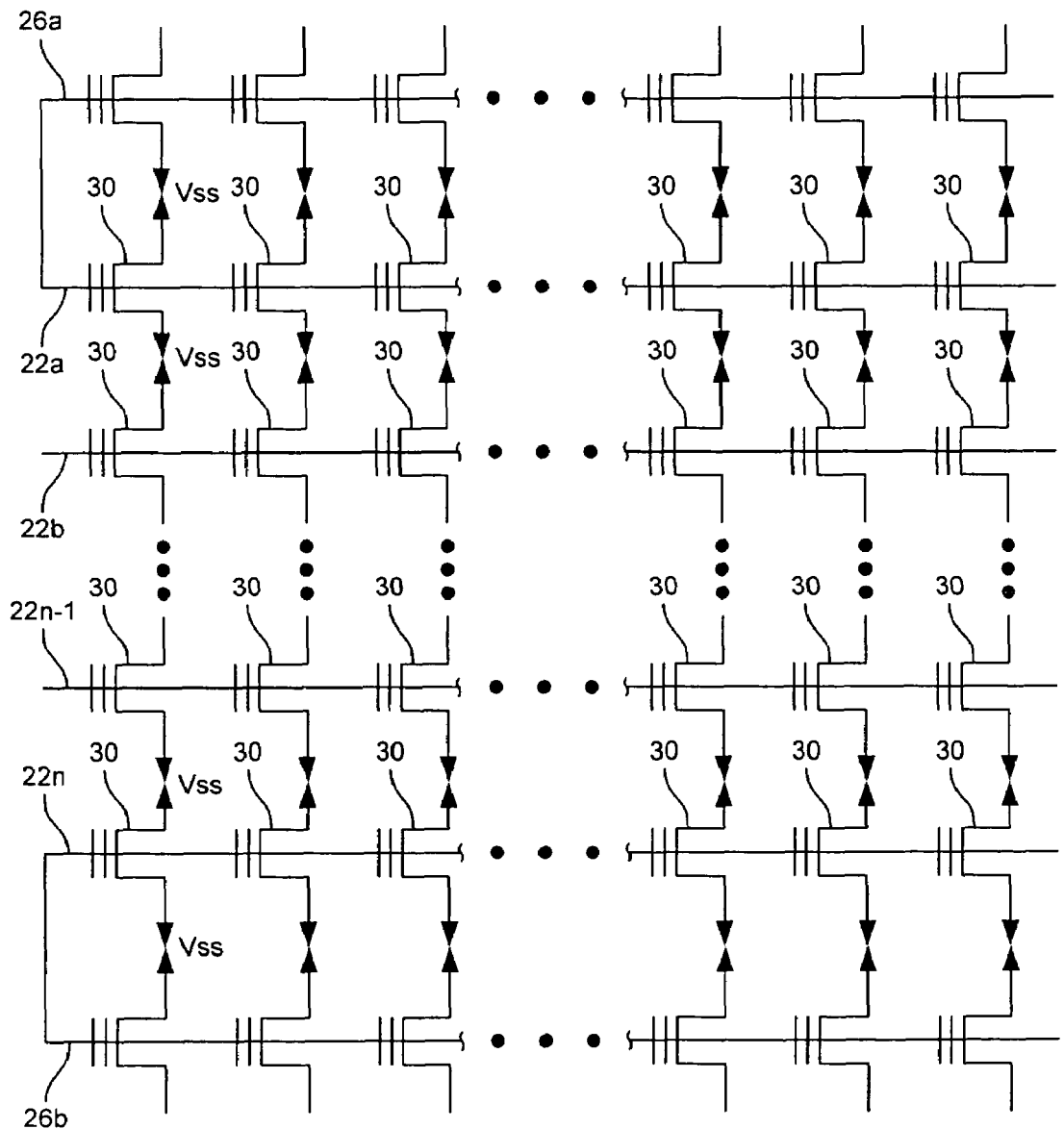
FIG. 5 is a schematic diagram of the core memory array sector during an erase operation according to the present invention.

With additional reference to FIG. 5, shown is a schematic diagram of the core memory array sector 10 during an erase operation. To erase the memory devices 30 of the sector 10 (e.g., a sector erase where multiple memory devices 30 or all memory devices 30 are erased simultaneous) a voltage can be applied to each of the wordlines 22. The voltage applied to the wordlines 22 can be referred to as a gate erase voltage. A voltage, as ground or other potential, can be applied to each bitline 14 during the erase operation. If appropriate, the substrate 12 can be grounded or connected to another voltage potential during the erase operation.

For example, in the embodiment where the memory devices 30 are floating gate memory devices 30, a channel erase operation (commonly referred to as a Fowler-Nordheim (FN) erase) can be used. In the illustrated example, about −9.3 volts can be applied to the wordlines 22 for a specified duration. During this time, a common voltage (Vss), such as ground or other potential, can be applied to the bitlines 14.

In the embodiment where the memory devices 30 are charge trapping dielectric memory devices 30 a "hot hole injection" (sometimes referred to as band-to-band (BTB) hot hole injection can be used. In hot hole injection, a gate voltage of, for example, about 4 volts to about −8 volts can be applied to the wordlines 22 and a drain voltage of, for example, about 4.5 volts to about 6.0 volts can be applied to the bitlines 14 functioning as a drain for the memory devices 30. Hot hole injection can include grounding the bitlines 14 functioning as a source for the memory devices 30. Such an erase can be carried out separately for the normal bit of the memory devices 30 and the complimentary bit of the memory devices 30. Under such erase conditions, a BTB tunnel current is created under the gate and holes are generated that accelerate from the drain into the channel. The holes are accelerated in the electrical field created near the drain/body junction and some of the accelerated holes surmount the oxide to semiconductor interface between the bottom dielectric layer 16 and the substrate 12. These holes are injected into the dielectric charge storing layer 18 to displace electrons (e.g., by recombination) and erase the cell.

During the erase operation, the dummy word lines 26 can be biased to reduced capacitive coupling respectively between the top wordline 22a and the first dummy wordline 30a and between the bottom wordline 22n and the second wordline 30b. In one embodiment, a bias voltage can be applied to the dummy wordlines 26. Application of a bias voltage can be carried out by coupling a desired voltage to the dummy wordlines 26 with appropriate logic components of the logic circuit 8. The bias voltage can be the gate erase voltage applied to the wordlines 22 during the erase operation. Alternatively, a voltage other than the gate erase voltage can be applied to the dummy wordlines 26 as the bias voltage.

In the illustrated embodiment, application of the bias to the dummy wordlines 26 is accomplished by electrically connecting the top wordline 22a to the first dummy wordline 26a and electrically connecting the bottom wordline 22n to the second dummy wordline 26b. Such electrical connections can be established with the logic circuit 8 and, as a result, is not necessarily a direct electrical connection. Rather, the electrical connection from top wordline 22a to first dummy wordline 26a and from bottom wordline 22n to second dummy wordline 26b can be through components of the logic circuit 8, such as pass transistors or other switching elements. In this embodiment, the bias voltage will be approximately that of the gate erase voltage, noting that some loss may be introduced from the components establishing the connection from wordline 22 to adjacent dummy wordline 26.

Figure 6:
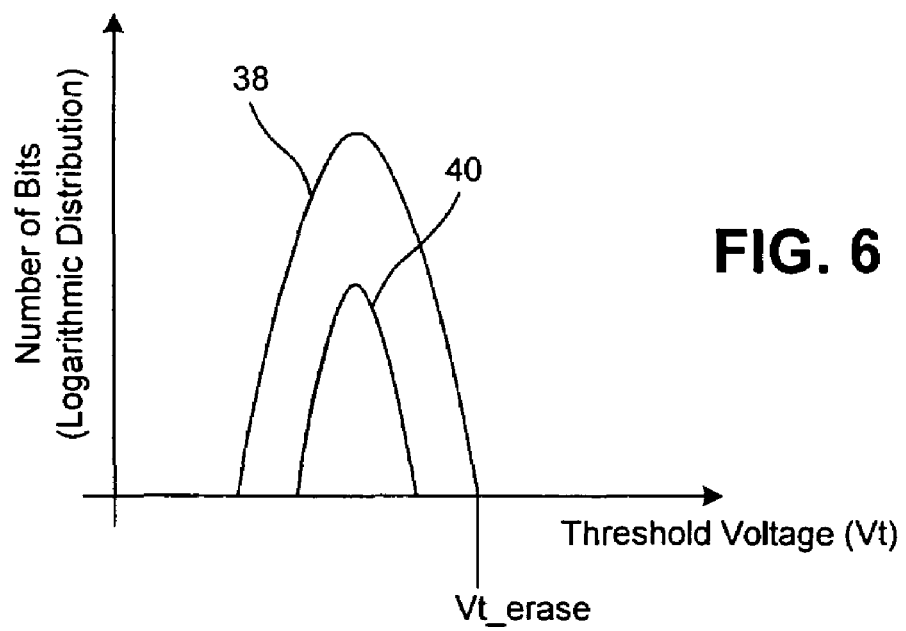
FIG. 6 is a graph of erase threshold voltage distribution for the flash memory array when erased according to the present invention.

FIG. 6 is a graph of erase threshold voltage distribution for the memory devices 30 of the sector 10 when erased according to the methods described herein. The graph includes a first distribution curve 38 corresponding to the threshold voltage distribution for the middle wordlines 22b through 22n-1 where insubstantial coupling to adjacent dummy wordlines 26 is present in the absence of dummy wordline 26 biasing. The graph includes a second distribution curve 40 corresponding to the threshold voltage distribution for the memory devices 30 of the top wordline 22a and the bottom wordline 22n when the dummy wordlines 26 are biased with approximately the potential applied to the wordlines 22 during the erase operation. As shown graphically, the curve 40 overlaps with the curve 38 such that a difference between a center of curve 38 and a center of curve 40 is kept to a minimum (e.g., less than 0.15 volts). As a result, the middle rows of cells (corresponding to wordlines 22b through 22n-1) will have a tendency to erase with about the same speed as the top and bottom rows of cells (corresponding to wordlines 22a and 22n). Accordingly, narrower erase distributions 38 and 40 can be achieved than when a bias potential is not applied to the dummy wordlines 26 during erase, thereby resulting in improved flash memory unit 2 operation.

Figure 7:
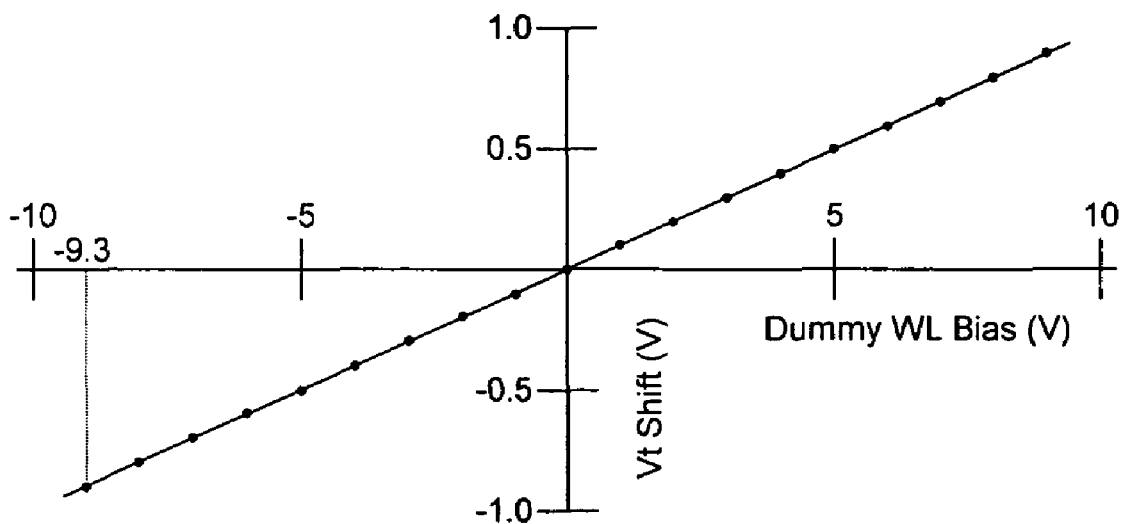
FIG. 7 is a plot that represents the effects of dummy wordline bias on erase speed.

FIG. 7 is a plot that represents the effects of dummy wordline bias on erase speed of the top and bottom rows of cells relative to the middle rows. More specifically, the plot shows the shift in threshold voltage for the second distribution curve 40 corresponding to the erase threshold voltage distribution for the memory devices 30 of the top wordline 22a and the bottom wordline 22n on the y-axis versus dummy wordline bias on the x-axis. As the dummy wordline bias negatively increases, the distribution curve 40 shifts downward along the threshold voltage axis and tends to have greater alignment with the curve 38 (compare FIGS. 1 and 6) as well as faster erase operation. In general, the relationship between dummy wordline bias and threshold voltage distribution shift is linear.

Following the application of the erase voltages to the memory devices 30, the erase operation can be verified using convention erase verification techniques. If indicated by the erase verification routine, re-erasing of the memory devices 30 can be conducted and/or an automatic program disturb (APD) or soft programming operation can be conducted. APD, which is also referred to as automatic program disturb after erase (APDE), is a process that corrects for such over-erased flash memory cells. During APD process, charge carriers (e.g., electrons) are reinjected into the charge storing layer after the erase process to restore the threshold voltage of the over-erased flash memory cells.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of erasing memory devices of a flash memory array having a plurality of operative wordlines and at least one dummy wordline adjacent an end one of the operative wordlines, comprising:

establishing an electrical connection between the dummy wordline and the end one of the operative wordlines; and applying a gate erase voltage to the wordlines.

2. The method according to claim 1, wherein the voltage of the dummy word line is approximately equal to the gate voltage.

3. The method according to claim 1, wherein the electrical connection downwardly shifts an erase threshold voltage distribution for the end one of the operative wordlines.

4. The method according to claim 3, wherein the voltage of the dummy word line and the shift in erase threshold voltage distribution have a generally linear relationship.

5. The method according to claim 3, wherein the erase threshold voltage distribution for the end one of the operative wordlines is shifted to overlap with an erase threshold distribution for the operative wordlines disposed between the end operative wordlines.

6. The method according to claim 1, wherein the memory devices are floating gate memory devices.

7. The method according to claim 6, wherein the floating gate memory devices are erased using a Fowler-Nordheim (FN) erase.

8. The method according to claim 1, wherein the memory devices are charge trapping dielectric memory devices having plural charge trapping regions.

9. The method according to claim 8, wherein the charge trapping dielectric memory devices are erased using band-to-band (BTB) hot hole injection.

10. The method according to claim 8, wherein a normal bit of each memory device and a complimentary bit of each memory device are erased in separate erase operations.

11. A flash memory unit configured for an erase operation, comprising:

a sector of memory devices defined by a plurality of operational wordlines and a plurality of bit lines;

at least one dummy wordline adjacent an end one of the operational wordlines; and a logic unit electrically connecting the dummy wordline and the end one of the operational wordlines.

12. The flash memory unit according to claim 11, wherein the memory devices are selected from one of floating gate memory devices and charge trapping dielectric memory devices.

* * * * *

UNITED STATES PATENT AND TRADEMARK OFFICE
CERTIFICATE OF CORRECTION

| | | |
|---|---|---|
| PATENT NO. | : 6,987,696 B1 | Page 1 of 1 |
| APPLICATION NO. | : 10/885268 | |
| DATED | : January 17, 2006 | |
| INVENTOR(S) | : Zhigang Wang et al. | |

It is certified that error appears in the above-identified patent and that said Letters Patent is hereby corrected as shown below:

On title page (73), replace "Advanced Micro Device, Inc." with --Spansion LLC--.

Signed and Sealed this

Eighth Day of May, 2007

JON W. DUDAS
*Director of the United States Patent and Trademark Office*